(12) United States Patent
Hyman et al.

(10) Patent No.: US 11,147,189 B2
(45) Date of Patent: Oct. 12, 2021

(54) HEAT SINK FOR HAND HELD EQUIPMENT

(71) Applicant: IXI Technology Holdings, Inc., Yorba Linda, CA (US)

(72) Inventors: Daniel Hyman, Long Beach, CA (US); Jeffrey Norris, Lake Forest, CA (US); Roberto Neil, Corona, CA (US)

(73) Assignee: IXI Technology Holdings, Inc., Yorba Linda, CA (US)

( * ) Notice: Subject to any disclaimer, the term of this patent is extended or adjusted under 35 U.S.C. 154(b) by 0 days.

(21) Appl. No.: 16/746,929

(22) Filed: Jan. 19, 2020

(65) Prior Publication Data

US 2021/0227721 A1 Jul. 22, 2021

(51) Int. Cl.
*H05K 7/20* (2006.01)
*F28F 3/02* (2006.01)

(52) U.S. Cl.
CPC .......... *H05K 7/20409* (2013.01); *F28F 3/02* (2013.01)

(58) Field of Classification Search
None
See application file for complete search history.

(56) References Cited

U.S. PATENT DOCUMENTS

| | | | | |
|---|---|---|---|---|
| 4,621,304 A * | 11/1986 | Oogaki | ............... | H01L 23/4006 165/185 |
| 5,012,386 A * | 4/1991 | McShane | ............... | H01L 23/057 361/715 |
| 5,387,815 A * | 2/1995 | Nishiguchi | ............. | H01L 23/10 257/704 |
| 6,028,355 A * | 2/2000 | Gates | .................. | H01L 23/3672 257/706 |
| 7,525,798 B2 * | 4/2009 | Schultz | ............. | H05K 7/20545 361/688 |
| 7,817,428 B2 * | 10/2010 | Greer, Jr. | ........... | H05K 7/20409 361/720 |
| 8,537,554 B1 | 9/2013 | Hockaday | | |
| 10,191,522 B2 * | 1/2019 | Morrison | ................. | H05K 7/20 |
| 2005/0036292 A1 * | 2/2005 | Chengalva | .......... | H01L 23/3677 361/715 |

(Continued)

FOREIGN PATENT DOCUMENTS

| | | |
|---|---|---|
| CN | 205623038 U | 10/2016 |
| CN | 208677570 U | 4/2019 |
| WO | 2012008569 A1 | 1/2012 |

*Primary Examiner* — Courtney L Smith
(74) *Attorney, Agent, or Firm* — The Watson IP Group, PLC; Jovan N. Jovanovic

(57) ABSTRACT

Hand held equipment has a body and a heat sink. The body defines an outer surface and a heat source therewithin. The heat sink forms a portion of the outer surface and is positioned in close proximity to the heat source so as to conduct heat therefrom. The heat sink has a base, a plurality of fins and a coating having low thermal conductivity (which may be a ceramic coating). The base has a lower and an upper surface. The lower surface is in close proximity to the heat source. The plurality of fins has a proximal end meeting the upper surface of the base, and a distal end extending away from the base. Each of the plurality of fins define a cross-sectional area and terminate at an outward surface. The coating extends over at least a portion of the outward surface of the plurality of fins. A heat sink is likewise disclosed.

12 Claims, 8 Drawing Sheets

(56) References Cited

U.S. PATENT DOCUMENTS

2006/0114655 A1\* 6/2006 Wallace ............. H05K 7/20127
  361/704
2012/0293952 A1\* 11/2012 Herring ................ H01L 23/367
  361/679.54
2019/0241435 A1\* 8/2019 Muramatsu .............. H05K 7/20

\* cited by examiner

HEAT SINK FOR HAND HELD EQUIPMENT

CROSS-REFERENCE TO RELATED APPLICATION

N/A

BACKGROUND OF THE DISCLOSURE

1. Field of the Disclosure

The disclosure relates in general to heat dissipation devices, and more particularly, to a heat sink well suited for use in association with hand held (including portable) equipment. Of course, while not limited thereto, the heat sink is well suited for use in association with devices that are handled and manipulated by a user.

2. Background Art

The dissipation of heat from various equipment can be a challenge. Specifically, heat generated by the equipment if not managed can lead to damage or premature failure of the equipment itself. Often, various conductive or convective devices can be utilized to drive heat away from the heat source of the equipment.

Problematically, there are diverging needs associated with hand held equipment. On the one hand, it is desirable to make the hand held devices as small and light as possible, and, to minimize the energy utilized by the devices. On the other hand, the dissipation of heat is typically improved through mass and size. One solution commonly deployed to increase heat dissipation is to use heat sinks. Heat sinks are devices typically comprising thermally conductive material to conduct heat away from a contacted heat source, and incorporate a plurality of thin material elements of "fins". Through conduction and convection and radiation, the heat from the heat source is dissipated through the fins and the interaction of the fins with the outside medium (commonly air, but sometimes other gaseous and/or liquid media). It is common to utilize such structures in the dissipation of heat generated by electronic devices such as integrated circuits and power supplies.

Problematically, heat sinks can themselves become quite hot during use. And, in many instances it may not be possible to touch or to have extended direct exposure to the fins themselves. That is, a user must stay a distance away from the fins of the device, or risk pain or skin damage, for example. There is a need to provide a heat sink that can efficiently remove heat from a heat source, while being safe to the touch for a user, or that provides adequate contact time for a user to adequately respond to the heat and contact prior to skin damage, especially for environments where contact often occurs.

SUMMARY OF THE DISCLOSURE

The disclosure is directed, in an aspect of the disclosure to hand held equipment, such as a hand held RF transmitter (by way of example, and not limitation), among other equipment, comprising a body and a heat sink. The body defines an outer surface and a heat source within a cavity defined by the body. The heat sink forms a portion of the outer surface of the body and positioned in close proximity to the heat source so as to conduct heat away from the heat source. The heat sink further comprises a base, a plurality of fins and a coating having low thermal conductivity. The base has a lower surface and an upper surface opposite the lower surface. The lower surface is in close proximity to the heat source. The plurality of fins has a proximal end meeting the upper surface of the base, and a distal end extending away from the base. Each of the plurality of fins define a cross-sectional area and terminate at an outward surface. The coating extends over at least a portion of the outward surface of the plurality of fins, and may comprise a ceramic coating.

In some configurations, the ceramic coating has a thickness of between 0.001" and 0.010", and more preferably between 0.001" and 0.004" and more preferably approximately 0.002".

In some configurations, the coating having a low thermal conductivity extends over substantially the entirety of the outward surface of the plurality of fins. Such a coating may comprise a ceramic coating.

In some configurations, the plurality of fins comprises a plurality of elongated fins defining a first side and a second side opposite the first side.

In some configurations, the plurality of elongated fins are spaced apart from each other so as to be substantially parallel to each other and substantially perpendicular to the upper surface of the base.

In some configurations, the outward surface of the plurality of fins define a hemispherical configuration.

In some configurations, the base and the plurality of fins comprise a single integrally formed configuration.

In some configurations, the base and the plurality of fins are formed from an aluminum alloy.

In some configurations, the upper surface and the plurality of fins are anodized (or protected with an anti-oxidation coating) and wherein the upper surface and the plurality of fins have a chemical film applied thereto.

In another aspect of the disclosure, the disclosure is directed to a heat sink. The heat sink further comprises a base, a plurality of fins and a ceramic coating. The base has a lower surface and an upper surface opposite the lower surface. The lower surface is in close proximity to the heat source. The plurality of fins have a proximal end meeting the upper surface of the base, and a distal end extending away from the base. Each of the plurality of fins define a cross-sectional area and terminate at an outward surface. The ceramic coating extends over at least a portion of the outward surface of the plurality of fins. The heat sink may have additional features which are like those disclosed with respect to the heat sink described above or herein with respect to the hand held device.

BRIEF DESCRIPTION OF THE DRAWINGS

The disclosure will now be described with reference to the drawings wherein.

DETAILED DESCRIPTION OF THE DISCLOSURE

Figure 1:
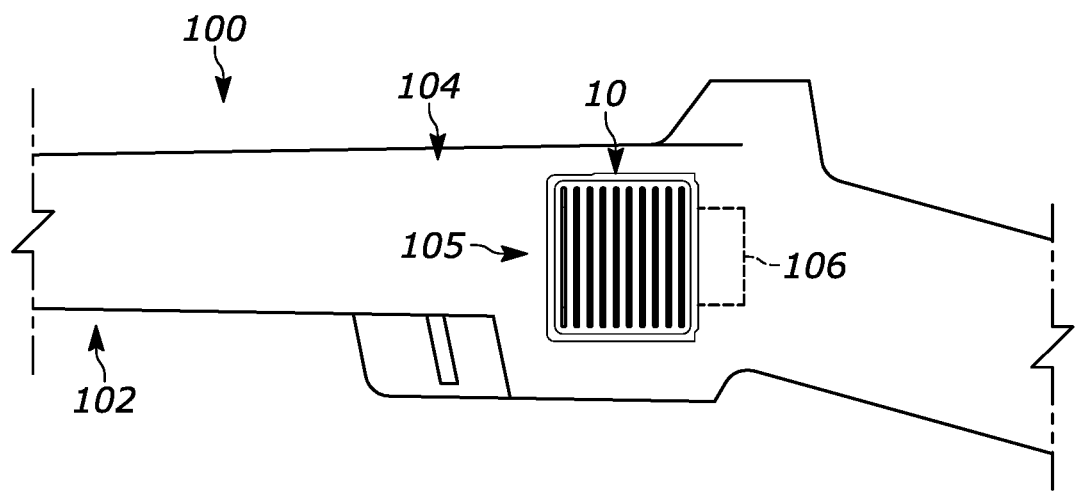
FIG. 1 of the drawings is a side elevational view of hand held equipment having a heat sink of the present disclosure.

While this disclosure is susceptible of embodiment in many different forms, there is shown in the drawings and described herein in detail a specific embodiment(s) with the understanding that the present disclosure is to be considered as an exemplification and is not intended to be limited to the embodiment(s) illustrated.

It will be understood that like or analogous elements and/or components, referred to herein, may be identified throughout the drawings by like reference characters. In addition, it will be understood that the drawings are merely schematic representations of the invention, and some of the components may have been distorted from actual scale for purposes of pictorial clarity.

Referring now to the drawings and in particular to FIG. 1, the disclosure is directed to a heat sink, such as heat sink 10. While not limited to any particular use, the heat sink 10 is well suited to use in association with hand held equipment, or equipment wherein contact with a user is likely to occur. In one example, the heat sink may be used in association with hand held equipment (in this case a hand held drone communication disruption device, or, RF transmitter) 100. The hand held equipment may comprise body 102 having outer surface 104, and heat source 106. In the configuration shown, heat source 106 is within the cavity defined by the body, with the heat sink 10 being forming a portion of the outer surface 104. As will be understood, the heat sink is configured to direct the heat from the heat source 106 to the outer surface so that it can be dissipated by the heat sink into the surrounding air. In some configurations, such as the configuration of FIGS. 7 and 8, the fins can extend through slits or openings in the body of hand held device.

Figure 2:
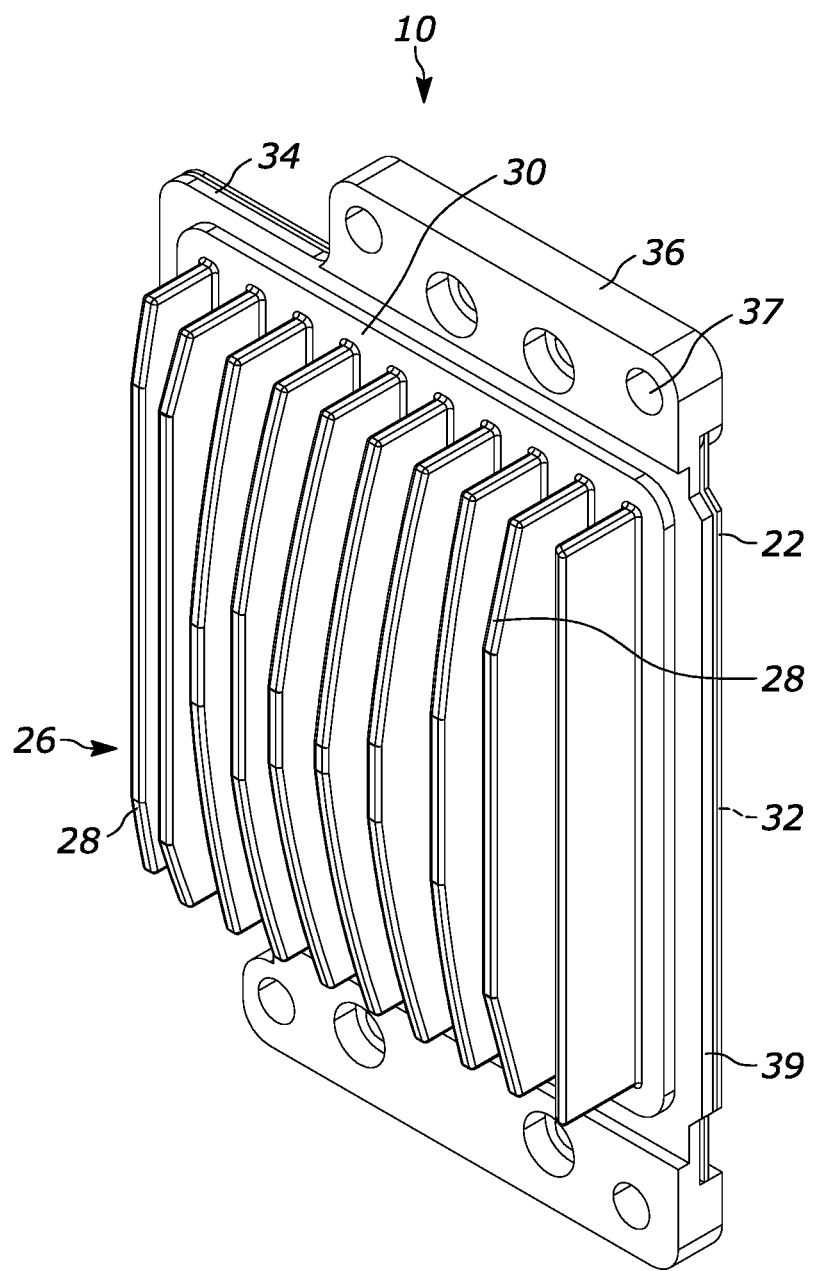
FIG. 2 of the drawings is a perspective view of a configuration of the heat sink of the present disclosure.

With reference to FIG. 2, heat sink 10 includes base 22, depending portion 24 (on some configurations), fins 26 and coating 28. In the configuration shown, the base, depending portion and the fins are formed from a single integrally molded, extruded, or otherwise formed component. The heat sink is formed from a thermally conductive material, such as a metal or alloy thereof. In some configurations, the heat sink may be formed from an Aluminum alloy (6061-T6). Of course, other alloys of Aluminum, the same Aluminum alloy at a different temper, or different metals, or metal alloys. The different metals and alloys from which the heat sink can be formed can be varied depending on both heat conduction properties, as well as material strength, ductility and other property standpoints. Additionally, while the heat sink is shown as being formed from a single integrally formed component, the heat sink may be formed from a plurality of components that are coupled together through different types of joining systems, such as fasteners, welding, adhering among others. In some configurations, it is advantageous to form the heat sink from a single formed component.

The heat sink surfaces (other than the lower surface 32 of the base and the depending portion) may be anodized, such as in black, per the specification MIL-A-8625 Type II (which specification is incorporated by reference in its entirety). Likewise, the material may be coated with a chemical film, that may be clear, per MIL-DTL-5541 Type I, Class 3 (which specification is likewise incorporated by reference in its entirety).

With reference to FIGS. 2 through 6, collectively, base 22 includes upper surface 30, lower surface 32 which cooperatively define the outer perimeter 34. Attachment flanges, such as attachment flange 36 may extend from the base or form a portion of the base, and such flanges may include openings that are configured to receive fasteners (i.e., smooth bore, threaded, or otherwise). These flanges and/or openings may likewise be configured to receive clips, pegs or other devices for alignment and/or attachment.

In the configuration shown, the upper surface of the base is substantially planar and defines a substantially flat surface. Additionally, the lower surface is likewise substantially planar, that is, generally on the portion from which the fins extend. As such, the base has a substantially uniform thickness. In other configurations, the base may be other than a uniform thickness. For example, and without limitation, the upper surface and/or the lower surface may be convex or concave or may include a particular topography that is not planar. This may be done on the lower surface so that the lower surface more closely follows the heat source to which it is coupled, abutting or in close proximity.

Figure 7:
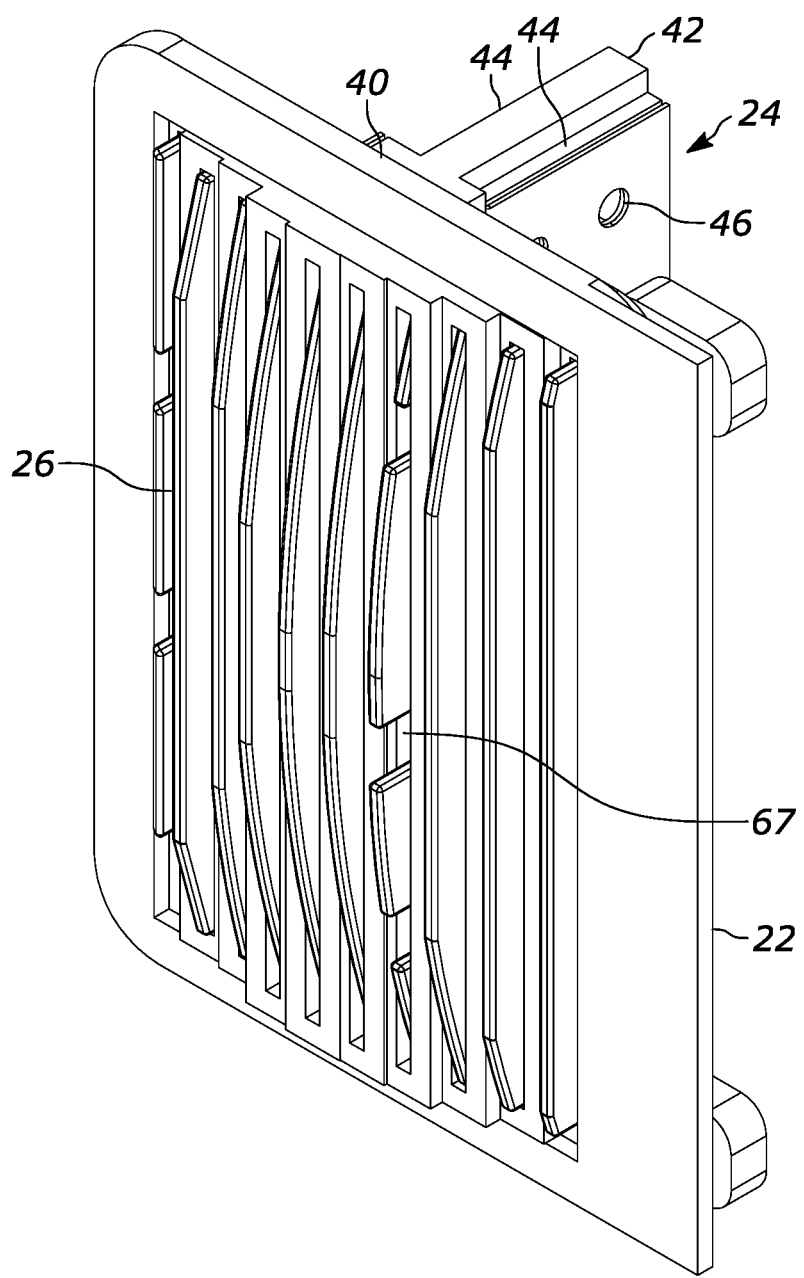
FIG. 7 of the drawings is a front perspective view of another configuration of the heat sink of the present disclosure.
Figure 8:
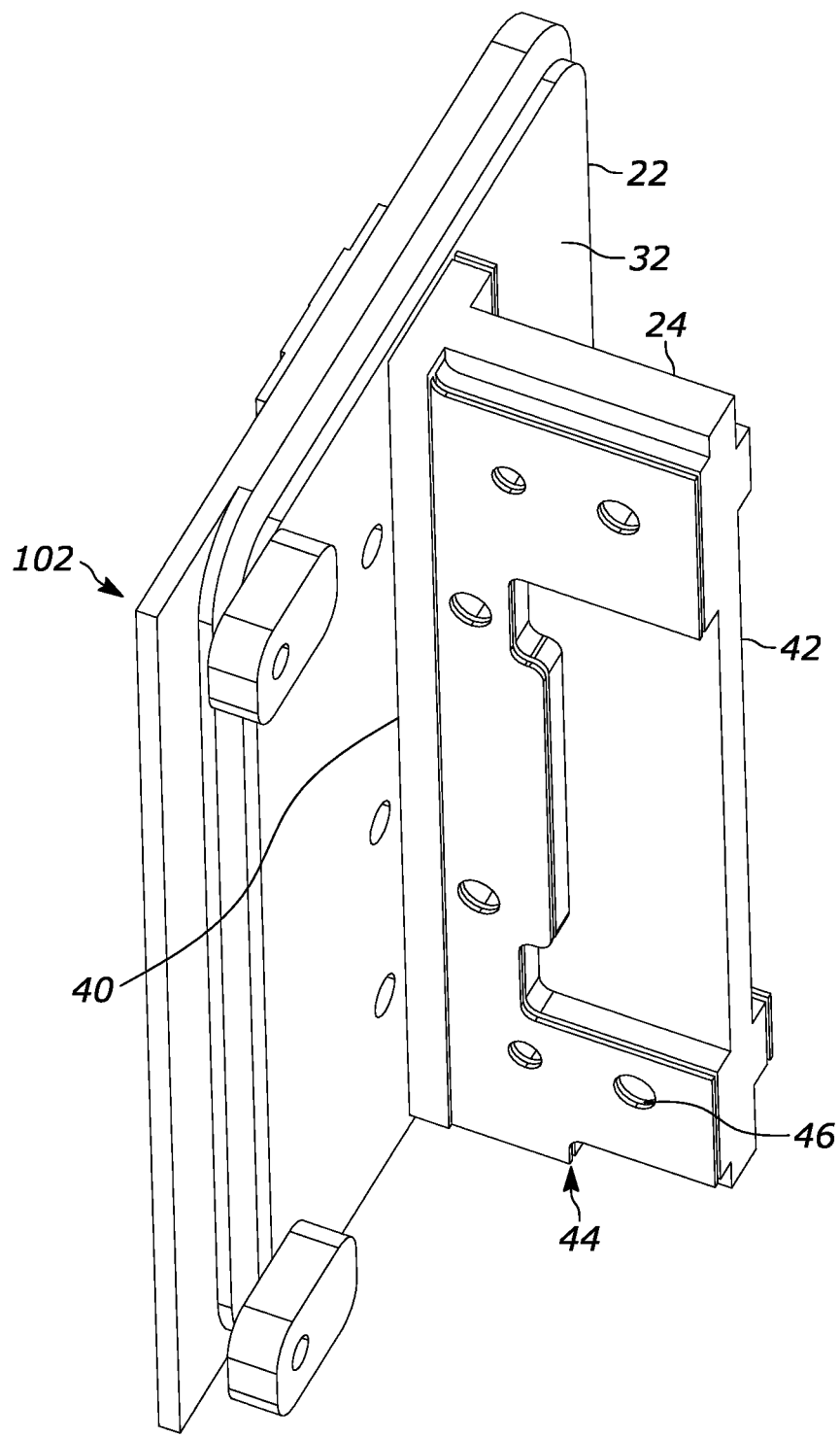
FIG. 8 of the drawings is a back perspective view of another configuration of the heat sink of the present disclosure.

In some configurations, such as the configuration of FIGS. 7 and 8, a depending portion 24 may extend from the lower surface 32. In the configuration shown in FIG. 2, the depending portion includes a panel that is perpendicular to the lower surface 32. The depending portion 24 includes a proximal end 40, a distal end 42, side surfaces 44. Attachment openings 46 may be defined in the depending portion for coupling to outside structures. Again, such a configuration may be necessitated or desirable due to the configuration and placement of the heat source. It will be understood that the depending portion may be of virtually any configuration and may be positioned in a number of different orientations. Additionally, the depending portion may be formed from a separate member which is coupled to the base 22 of the heat sink through a number of different attachment structures described above.

Figure 3:
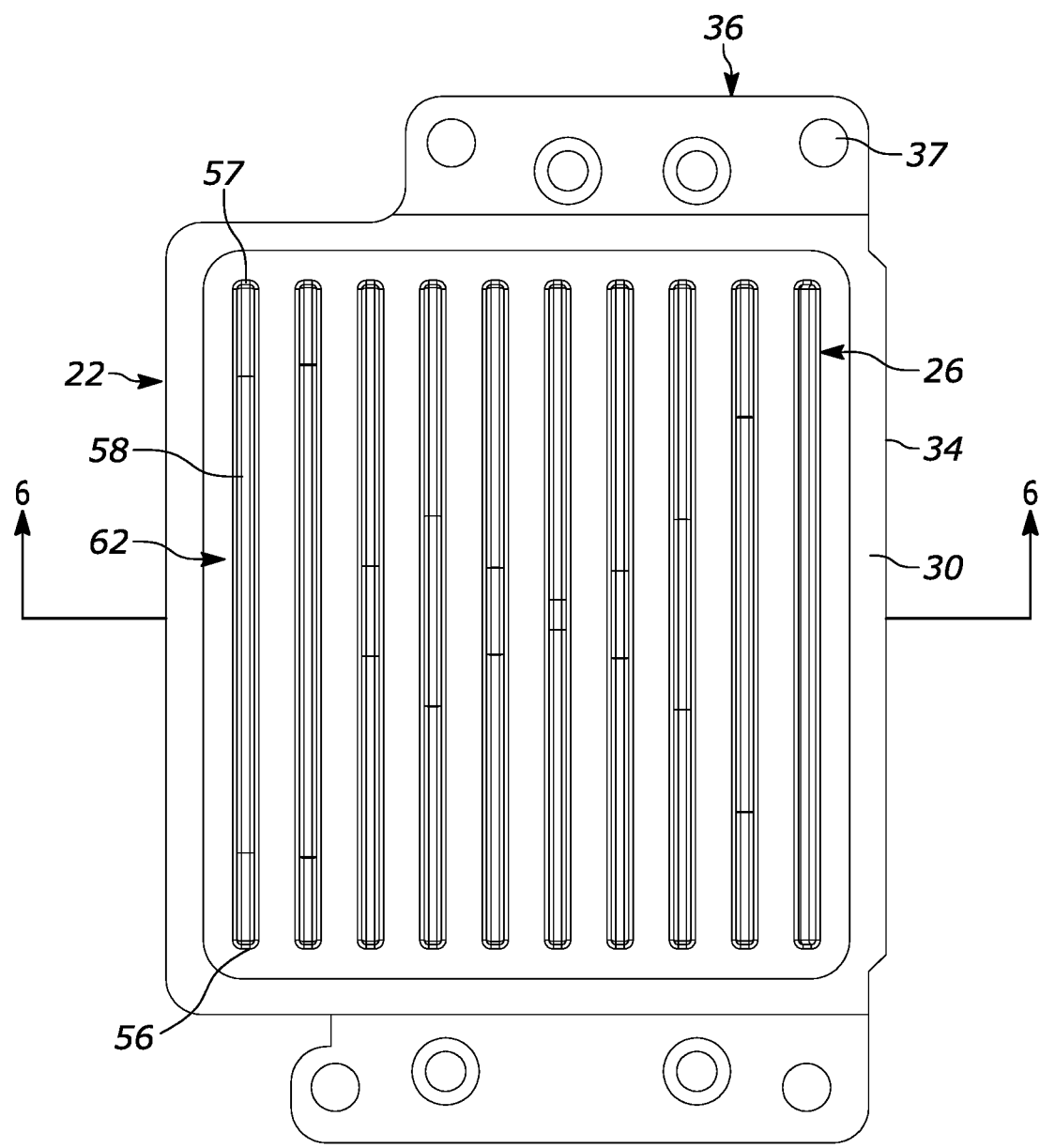
FIG. 3 of the drawings is a front plan view of a configuration of the heat sink of the present disclosure.
Figure 4:
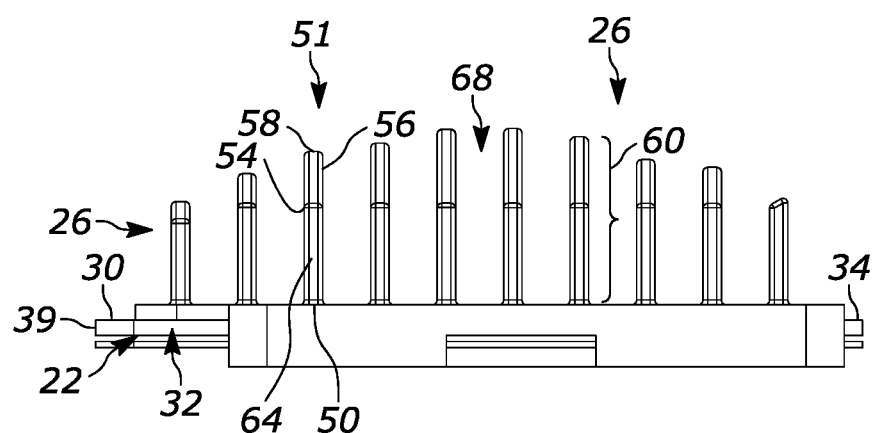
FIG. 4 of the drawings is a bottom elevational view of a configuration of the heat sink of the present disclosure.
Figure 5:
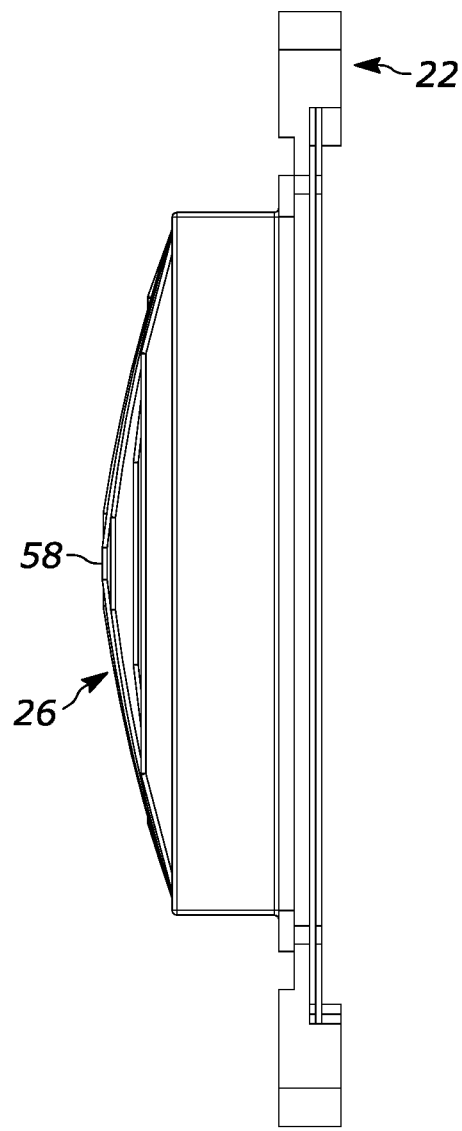
FIG. 5 of the drawings is a side elevational view of a configuration of the heat sink of the present disclosure.

With reference to FIGS. 2 through 6, fins 26 are shown as comprising a plurality of members that extend outwardly from the upper surface 30 of the base 22. In the configuration shown, the fins are generally parallel to each other and perpendicular to the upper surface 30 of the base 22. In the configuration shown in the Figures, a total of 10 fins are disclosed. The fins are substantially uniformly spaced apart from each other so as to defined by passages, such as passages 68. As can be seen in FIG. 2, the fins each have a different shape. In the configuration of FIG. 3, the fins may have different shapes, while they are outwardly concave in multiple directions so as to define a hemispherical configuration.

One of the fins 26 will be described with the understanding that similar features are found on the other fins. Fin 26 includes proximal end 50 and distal end 51, first side surface 53 and second side surface 54, and first end surface 56 and second end surface 57 to define a cross-sectional area. In the configuration shown, the first side surface and the second side surface are substantially parallel to each other, as are the first end surface and the second end surface. The distal end of these surfaces terminate at the outward surface 58. In the configuration shown, the outward surface 58 is substantially perpendicular to the first end surface and the second end surface. It will be understood that some of the fins may be broken up by spaces, such as space 67 (which spaces may be associated with openings that are configured to receive screws, pins or other structures).

It will be understood that in other configurations, the fins may be oblique relative to each other and relative to the upper surface of the base. For example, the fins may extend outwardly in a radial pattern from a generally curved upper surface of the base. In other configurations, the fins may be other than uniformly space, and may take on different angular relationships relative to other fins and relative to the upper surface of the base. In still other configurations, the fins may comprise spikes of various cross-sectional configurations, and, for example, may be positioned in arrays. In any such case, it will be understood that a fin is defined as a member that extends outwardly from the upper surface of the base and terminates in an outward surface 58, and may be of varying length, width, angular relationship with the base, and cross-section.

In the configuration shown, and by way of example, the base is on the order of 0.050" thick, with a width of approximately 2.515 inches and a width of approximately 3.690" in length. The fins are approximately 0.060" in thickness, while being spaced apart from each other by approximately 0.158".

Figure 6:
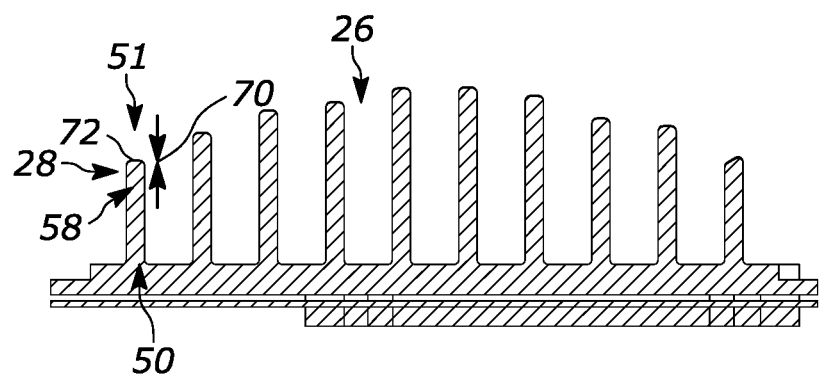
FIG. 6 of the drawings is a cross-sectional view of a configuration of the heat sink of the present disclosure, taken generally about lines 6-6 of FIG. 3.
Figure 6A:
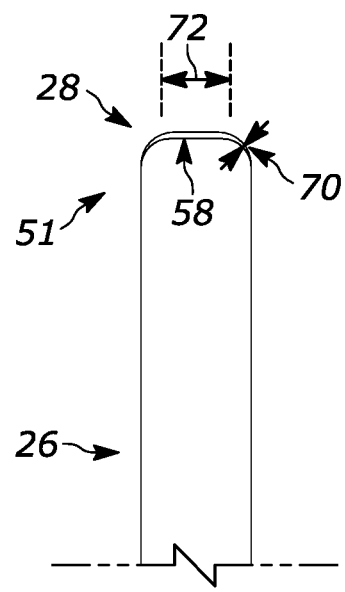
FIG. 6a of the drawings is an enlarged partial cross-sectional view of a portion of one of the fins shown in FIG. 6.

With particular further reference to FIGS. 6 and 6a, coating 28 may be applied to the outward surface 58 of the fins 26, which coating comprises a low thermal conductivity coating. In the configuration shown, a ceramic based coating having a relatively low thermal conductivity can be utilized, wherein the ceramic based coating has a thickness of between 0.001" and 0.010", and more preferably approximately 0.002". In the configuration shown, the ceramic coating comprises a Cerakote C-Ceries Ceramic Coating available from NIC Industries, Inc. of White City, Oreg. In the particular configuration, Cerakote C-7300 was utilized. Such a coating is air cured and reaches full cure in approximately five days. Such a coating has approximately 20-50% Ambient temperature-curable refractory resin(s), 15-30% ceramic and/or metallic pigments and colorants, 0-1% Silicone-based rheology modifiers and 20-65% p-chlorobenzotrifluoride. Of course, the disclosure is not limited to the particular ceramic coating (which can be deemed to be exemplary), and it will be understood that other ceramic coatings (which may air cured, oven cured or otherwise) are likewise contemplated. It is contemplated that the coatings may be applied to more than the outward surface if it is determined that it is advantageous to apply the coating in additional locations. In many instances it may only be necessary to apply the same to the outward surface.

It will be understood that the coating may be applied to the entire outward surface 58 or portions of the outward surface 58. Additionally, it will be understood that, while not required, the coating may be extended to other portions of the fins or the base.

It has been found that even a coating of 0.002" on the outward surfaces 58 allows for an increase in the hot touch temperature limits for pain threshold and skin damage of regions which have a probability of skin (such as finger or the like) or clothed user contact. Moreover, it has been determined that a relatively thin coating on the outward surfaces of the fins (comprises a fraction of the surface area of the fins for dissipation), and therefore, has a minimal effect on the performance of the heat exchanger and the ability to dissipate heat from the heat source.

Advantageously, the use of the coating 28 allows for the placement of the heat sink in a position wherein the user contact is prevalent without requiring protective cages or other structures around the heat sink. Additionally, the heat sink can be deployed in a region where such a heat sink would not have otherwise been deployed. Furthermore, the heat sink is capable of allows for an increase in the hot touch temperature limits. Further still, the size of the heat sink and the configuration of the heat sink can be optimized with limited concern for direct exposure to the skin of a user.

The foregoing description merely explains and illustrates the disclosure and the disclosure is not limited thereto except insofar as the appended claims are so limited, as those skilled in the art who have the disclosure before them will be able to make modifications without departing from the scope of the disclosure.

What is claimed is:

1. A hand held equipment comprising:
   body defining an outer surface and a heat source within a cavity defined by the body; and
   a heat sink forming a portion of the outer surface of the body and positioned in close proximity to the heat source so as to conduct heat away from the heat source, the heat sink further comprising:
      a base having a lower surface and an upper surface opposite the lower surface, the lower surface being in close proximity to the heat source;
      a plurality of fins having a proximal end meeting the upper surface of the base, and a distal end extending away from the base, each of the plurality of fins defining a cross-sectional area and terminating at an outward surface; and
      a coating having low thermal conductivity extending over at least a portion of the outward surface of the plurality of fins;
   wherein the plurality of fins are elongated fins defining a first side and a second side opposite the first side;
   wherein the plurality of elongated fins are spaced apart from each other so as to be substantially parallel to each other and substantially perpendicular to the upper surface of the base; and
   wherein the outward surface of the plurality of fins define a hemispherical configuration.

2. The hand held equipment of claim 1 wherein the coating has a thickness of between 0.001" and 0.010", and more preferably between 0.001" and 0.004" and more preferably approximately 0.002".

3. The hand held equipment of claim 2 wherein the coating extends over substantially the entirety of the outward surface of the plurality of fins, and comprises a ceramic coating.

4. The hand held equipment of claim 1 wherein the base and the plurality of fins comprise a single integrally formed configuration.

5. The hand held equipment of claim 1 wherein the base and the plurality of fins are formed from an aluminum alloy.

6. A hand held equipment comprising:
   body defining an outer surface and a heat source within a cavity defined by the body; and
   a heat sink forming a portion of the outer surface of the body and positioned in close proximity to the heat source so as to conduct heat away from the heat source, the heat sink further comprising:
      a base having a lower surface and an upper surface opposite the lower surface, the lower surface being in close proximity to the heat source;
      a plurality of fins having a proximal end meeting the upper surface of the base, and a distal end extending away from the base, each of the plurality of fins defining a cross-sectional area and terminating at an outward surface; and a coating having low thermal conductivity extending over at least a portion of the outward surface of the plurality of fins;

wherein the base and the plurality of fins are formed from an aluminum alloy; and wherein the upper surface and the plurality of fins are anodized and wherein the upper surface and the plurality of fins have a chemical film applied thereto.

7. A heat sink comprising:

a base having a lower surface and an upper surface opposite the lower surface, the lower surface structurally configured to be placed in close proximity to a heat source;

a plurality of fins having a proximal end meeting the upper surface of the base, and a distal end extending away from the base, each of the plurality of fins defining a cross-sectional area and terminating at an outward surface; and a coating having low thermal conductivity extending over at least a portion of the outward surface of the plurality of fins;

wherein the plurality of fins are elongated fins defining a first side and a second side opposite the first side;

wherein the plurality of elongated fins are spaced apart from each other so as to be substantially parallel to each other and substantially perpendicular to the upper surface of the base; and wherein the outward surface of the plurality of fins define a hemispherical configuration.

8. The heat sink of claim 7 wherein the coating has a thickness of between 0.001" and 0.010", and more preferably between 0.001" and 0.004" and more preferably approximately 0.002".

9. The heat sink of claim 8 wherein the coating extends over substantially the entirety of the outward surface of the plurality of fins, and wherein the coating comprises a ceramic.

10. The heat sink of claim 7 wherein the base and the plurality of fins comprise a single integrally formed configuration.

11. The heat sink of claim 7 wherein the base and the plurality of fins are formed from an aluminum alloy.

12. A heat sink comprising:

a base having a lower surface and an upper surface opposite the lower surface, the lower surface structurally configured to be placed in close proximity to a heat source;

a plurality of fins having a proximal end meeting the upper surface of the base, and a distal end extending away from the base, each of the plurality of fins defining a cross-sectional area and terminating at an outward surface; and a coating having low thermal conductivity extending over at least a portion of the outward surface of the plurality of fins;

wherein the base and the plurality of fins are formed from an aluminum alloy; and wherein the upper surface and the plurality of fins are one of anodized or otherwise coated with an anti-oxidation coating and wherein the upper surface and the plurality of fins have a chemical film applied thereto.

* * * * *